US012707953B2

(12) United States Patent
Yang et al.

(10) Patent No.: US 12,707,953 B2
(45) Date of Patent: Aug. 11, 2026

(54) SEMICONDUCTOR DEVICE INCLUDING SELF-ALIGNED BACKSIDE CONTACT STRUCTURE FORMED BASED ON CONTACT ISOLATION LAYER

(71) Applicant: Samsung Electronics Co., Ltd., Suwon-si (KR)

(72) Inventors: Myung Yang, Niskayuna, NY (US); Wonhyuk Hong, Clifton Park, NY (US); Myunghoon Jung, Clifton Park, NY (US); Jongjin Lee, Clifton Park, NY (US); Jaejik Baek, Watervliet, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/221,696

(22) Filed: Jul. 13, 2023

(65) Prior Publication Data

US 2024/0282670 A1 Aug. 22, 2024

Related U.S. Application Data

(60) Provisional application No. 63/447,212, filed on Feb. 21, 2023.

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01);
(Continued)

(58) Field of Classification Search
CPC ..... H10W 20/20; H10D 30/014; H10D 30/43; H10D 30/6735; H10D 30/6757;
(Continued)

(56) References Cited

U.S. PATENT DOCUMENTS 11,164,792 B2 11/2021 Xie et al.
11,302,711 B2 4/2022 Oh
(Continued)

FOREIGN PATENT DOCUMENTS

CN 115565949 A 1/2023
EP 4 089 723 A1 11/2022
TW 202129925 A 8/2021

OTHER PUBLICATIONS

Communication issued on Jun. 28, 2024 by the European Patent Office for European Patent Application No. 24150929.8.

*Primary Examiner* — Dao H Nguyen
(74) *Attorney, Agent, or Firm* — Myers Bigel, P.A.

(57) ABSTRACT

A semiconductor device includes: at least one transistor comprising source/drain regions and $1^{st}$ gate structure; a contact isolation layer below the $1^{st}$ gate structure; and a backside contact plug connected to at least one of the $1^{st}$ source/drain regions, wherein the backside contact plug is formed below the $1^{st}$ source/drain region and extended to a region below the $1^{st}$ gate structure, and isolated from the $1^{st}$ gate structure by the contact isolation layer.

20 Claims, 13 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |
| ***H10D 84/83*** | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 84/0128* (2025.01); *H10D 84/013* (2025.01); *H10D 84/0149* (2025.01); *H10D 84/0151* (2025.01); *H10D 84/038* (2025.01); *H10D 84/83* (2025.01)

(58) Field of Classification Search
CPC ............. H10D 30/6729; H10D 62/121; H10D 62/151; H10D 84/0128; H10D 84/013; H10D 84/0149; H10D 84/0151; H10D 84/038; H10D 84/83; H10D 84/0158; H10D 84/834; H10D 64/251; H10D 88/00; H10D 88/01
See application file for complete search history.

(56) References Cited

U.S. PATENT DOCUMENTS

| | | | | |
|---|---|---|---|---|
| 11,563,003 | B2 * | 1/2023 | Zhang | H10D 30/6757 |
| 2021/0359091 | A1 | 11/2021 | Hsu et al. | |
| 2021/0376093 | A1 | 12/2021 | Chu et al. | |
| 2022/0102274 | A1 | 3/2022 | Chien et al. | |
| 2022/0139911 | A1 | 5/2022 | Wei et al. | |
| 2022/0216340 | A1 | 7/2022 | Lin et al. | |
| 2022/0310804 | A1 | 9/2022 | Su et al. | |
| 2022/0367520 | A1 | 11/2022 | Hong et al. | |
| 2022/0406715 | A1 | 12/2022 | Xie et al. | |
| 2023/0067804 | A1 | 3/2023 | Shen et al. | |
| 2023/0215767 | A1 * | 7/2023 | Xie | H10D 30/43 257/329 |
| 2024/0196586 | A1 * | 6/2024 | Anderson | H10D 84/038 |
| 2024/0203990 | A1 * | 6/2024 | Xie | H10D 64/017 |
| 2024/0204067 | A1 * | 6/2024 | Xie | H01L 23/5286 |

* cited by examiner

10A 10B 116 128 W1 W2 I I' II II' III III' 127 123R 113R 125 142 127 123L 117 113L D1 D2 D3

10A
10B
127
126
127
123R
123R
113R
113R
107
107
106
131
108
III
III'

Figure 16:
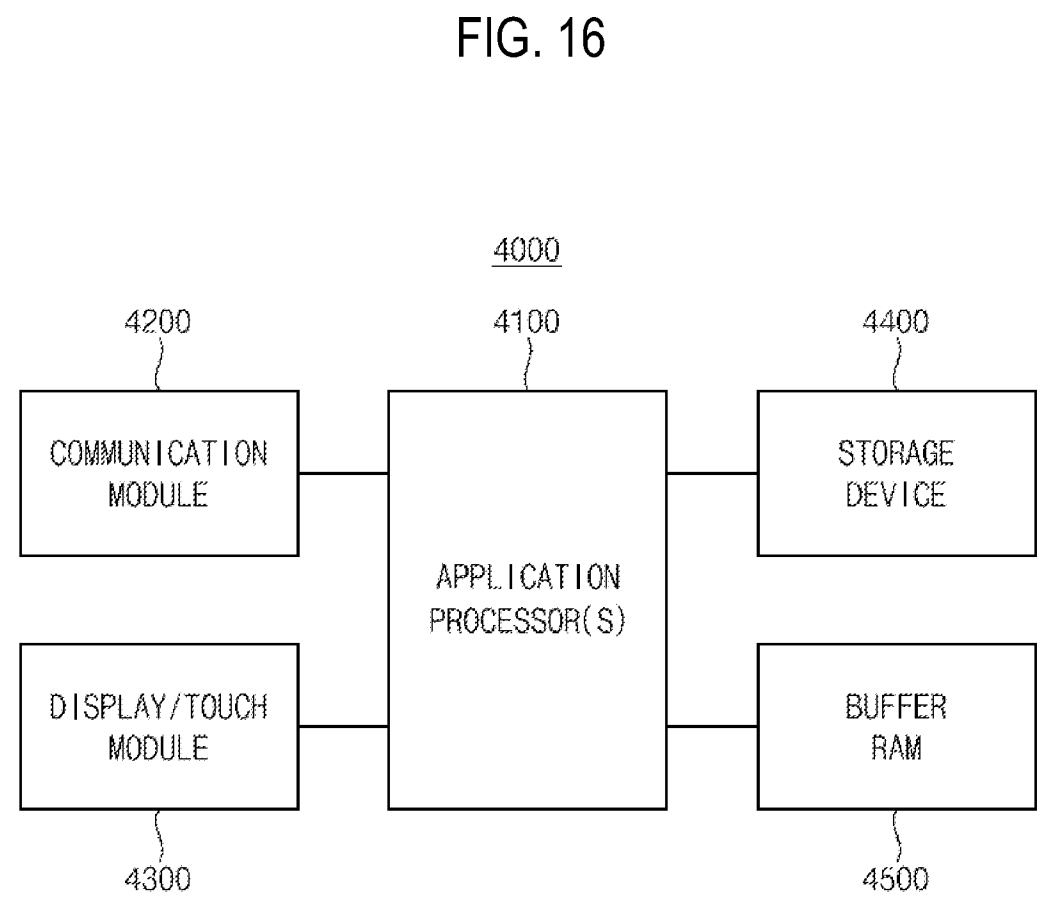

4100 APPLICATION PROCESSOR(S)

4200 COMMUNICATION MODULE

4300 DISPLAY/TOUCH MODULE

4400 STORAGE DEVICE

4500 BUFFER RAM

SEMICONDUCTOR DEVICE INCLUDING SELF-ALIGNED BACKSIDE CONTACT STRUCTURE FORMED BASED ON CONTACT ISOLATION LAYER

CROSS-REFERENCE TO RELATED APPLICATION

This application is based on and claims priority from U.S. Provisional Application No. 63/447,212 filed on Feb. 21, 2023 in the U.S. Patent and Trademark Office, the disclosure of which is incorporated herein in its entirety by reference.

BACKGROUND

1. Field

Apparatuses and methods consistent with example embodiments of the disclosure relate to a semiconductor device including a plurality of three-dimensional stacked field-effect transistors (3DSFETs) in which self-aligned backside contact plugs are formed using contact isolation layers.

2. Description of Related Art

A 3DSFET device formed of a lower field-effect transistor and an upper field-effect transistor stacked thereon has been introduced to respond to fast-growing demand for an integrated circuit having a high device density and performance. Each of the lower field-effect transistor and the upper field-effect transistor forming the 3DSFET may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, or as a multi-bridge channel field-effect transistor (MBCFET).

The 3DSFET may require a plurality of contact plugs (or contact structures) for each of the lower field-effect transistor and the upper field-effect transistor. For example, an upper contact plug is connected to an upper source/drain region of the upper field-effect transistor, and a lower contact plug is connected to a lower source/drain region of the lower field-effect transistor. The contact plugs which may be referred to as middle-of-line (MOL) structures may connect the source/drain regions to a voltage source or another circuit element through a back-end-of-line (BEOL) structure such as a BEOL metal line formed vertically above the MOL structures and front-line-of-end (FEOL) structures such as the source/drain regions of the 3DSFET.

However, formation of the lower contact plug in the 3DSFET is complicated and difficult when the lower field-effect transistor and the upper field-effect transistor have the same size in their channel structures and source/drain regions. This is because a lower source/drain region may be vertically overlapped by a same-sized upper source/drain region in the 3DSFET, whereby the lower contact plug vertically extended from the BEOL structure may not land on a top surface of the lower source/drain region in a nano-scale footprint of a semiconductor device including the 3DSFET.

To address this difficulty of forming the lower contact plug on the lower source/drain region of a 3DSFET, the 3DSFET may be formed to have a smaller-width upper channel structure and a smaller-width upper source/drain region than the lower channel structure and the lower source/drain region, respectively, so that an upper contact plug connected to a BEOL metal line can be vertically extended down therefrom through a region above the lower source/drain region at a side of the smaller-width upper source/drain region. This region is referred to as a "non-overlapping region" herein. Alternatively, a backside distribution network (BSPDN) structure may be provided to connect the lower source/drain region or even an upper source/drain region of the 3DSFET to a voltage source or another circuit element. The BSPDN structure may formed at a back side of the 3DSFET, and include a backside contact plug and a backside metal line such as a backside power rail, etc. which are buried in a substrate or a backside interlayer dielectric (ILD) structure.

However, formation of the backside contact plug for the 3DSFET still exposes at least a risk of misalignment between the backside contact plug and the lower source/drain region or an unwanted connection of the backside contact plug to a gate structure because of a complicated overlay at the back side of the 3DSFET.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device including a plurality of 3DSFETs in which a self-aligned backside contact plug is formed using a contact isolation layer for at least one of the 3DSFETs.

According to an embodiment, there is provided a semiconductor device which may include: a $1^{st}$ transistor including $1^{st}$ source/drain regions and a $1^{st}$ gate structure; a contact isolation layer below the $1^{st}$ gate structure; and a backside contact plug connected to at least one of the $1^{st}$ source/drain regions, wherein the backside contact plug is formed below the $1^{st}$ source/drain region and extended to a region below the $1^{st}$ gate structure, and isolated from the $1^{st}$ gate structure by the contact isolation layer.

According to an embodiment, the semiconductor device may further include: a $2^{nd}$ transistor including $2^{nd}$ source/drain regions and a $2^{nd}$ gate structure; and a $1^{st}$ isolation structure isolating one of the $2^{nd}$ source/drain regions from the $1^{st}$ source/drain region, wherein the $2^{nd}$ transistor is adjacent to the $1^{st}$ transistor in a $1^{st}$ horizontal direction, wherein a shallow trench isolation (STI) region is formed between the $2^{nd}$ source/drain region and the $1^{st}$ source/drain region and below the $1^{st}$ isolation structure, and wherein the contact isolation layer is formed in the STI region.

According to an embodiment, the contact isolation layer may be formed of silicon nitride, and the isolation structure may be formed of silicon oxide.

According to an embodiment, there is provided a semiconductor device which may include: at least one transistor including $1^{st}$ source/drain regions and a gate structure; a contact isolation layer below at least one of the $1^{st}$ source/drain regions; a backside contact plug connected to the $1^{st}$ source/drain region; and an STI region at a side of the $1^{st}$ source/drain region, wherein the STI region includes the contact isolation layer, and the backside contact plug is extended to a region below the STI region.

According to an embodiment, the semiconductor device may further include: a $2^{nd}$ transistor including $2^{nd}$ source/drain regions and a $2^{nd}$ gate structure; and an isolation structure isolating one of the $2^{nd}$ source/drain regions from the $1^{st}$ source/drain region, wherein the $2^{nd}$ transistor is adjacent to the $1^{st}$ transistor in a horizontal direction, and wherein the contact isolation layer and the isolation structure include different materials.

According to embodiments, there is provided a method of manufacturing a semiconductor device. The method may include: providing a channel stack on a substrate with a sacrificial structure therebetween; forming a shallow trench isolation (STI) region at a side of the channel structure; replacing the sacrificial structure with a contact isolation layer; forming a portion of the sacrificial structure in the STI region; forming source/drain regions at both ends of the channel stack; forming a gate structure; replacing the substrate with an isolation structure; forming a contact hole in the isolation structure to expose at least one of the source/drain regions; and forming a backside contact plug in the contact hole.

BRIEF DESCRIPTION OF DRAWINGS

Example embodiments of the disclosure will be more clearly understood from the following detailed description taken in conjunction with the accompanying drawings in which:

Figures 1A, 1B:
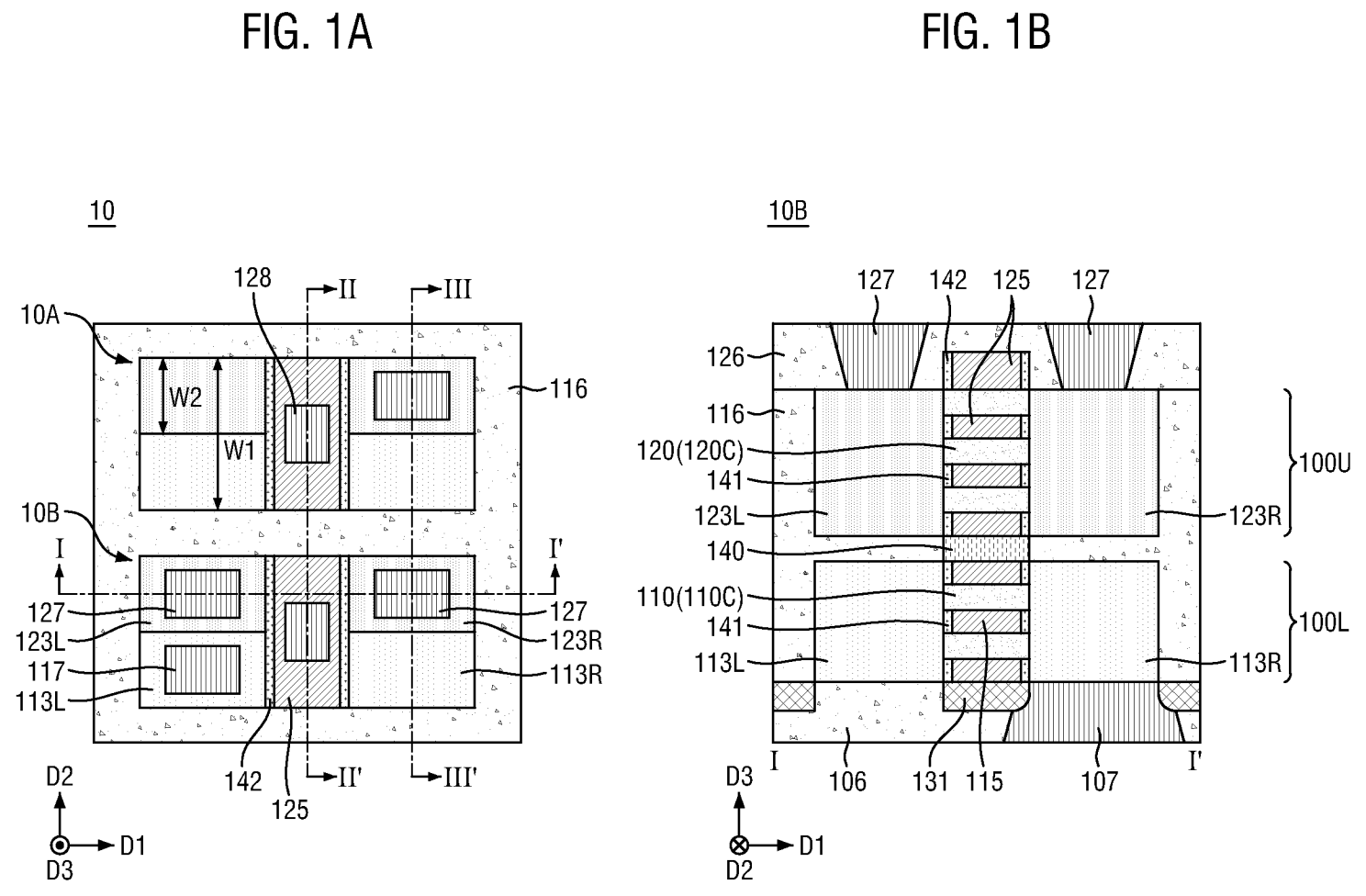

FIG. 1A illustrates a top plan view of a semiconductor device including a plurality of 3DSFETs in which self-aligned backside contact plugs are formed using contact isolation layers, according to an embodiment, FIG. 1B illustrates a cross-section view of the semiconductor device of FIG. 1A along a line I-I' shown in FIG. 1A.

FIGS. 2 to 14A-14B illustrate cross-section view of intermediate semiconductor devices in a channel-width direction after respective operations manufacturing the semiconductor device shown in FIGS. 1A-1D are performed, according to embodiments;

FIG. 16 is a schematic block diagram illustrating an electronic device including the semiconductor device shown in FIGS. 1A-1D or at least one of 3DSFETs included in the semiconductor device, according to an example embodiment.

DETAILED DESCRIPTION OF EMBODIMENTS

Figures 1C, 1D:
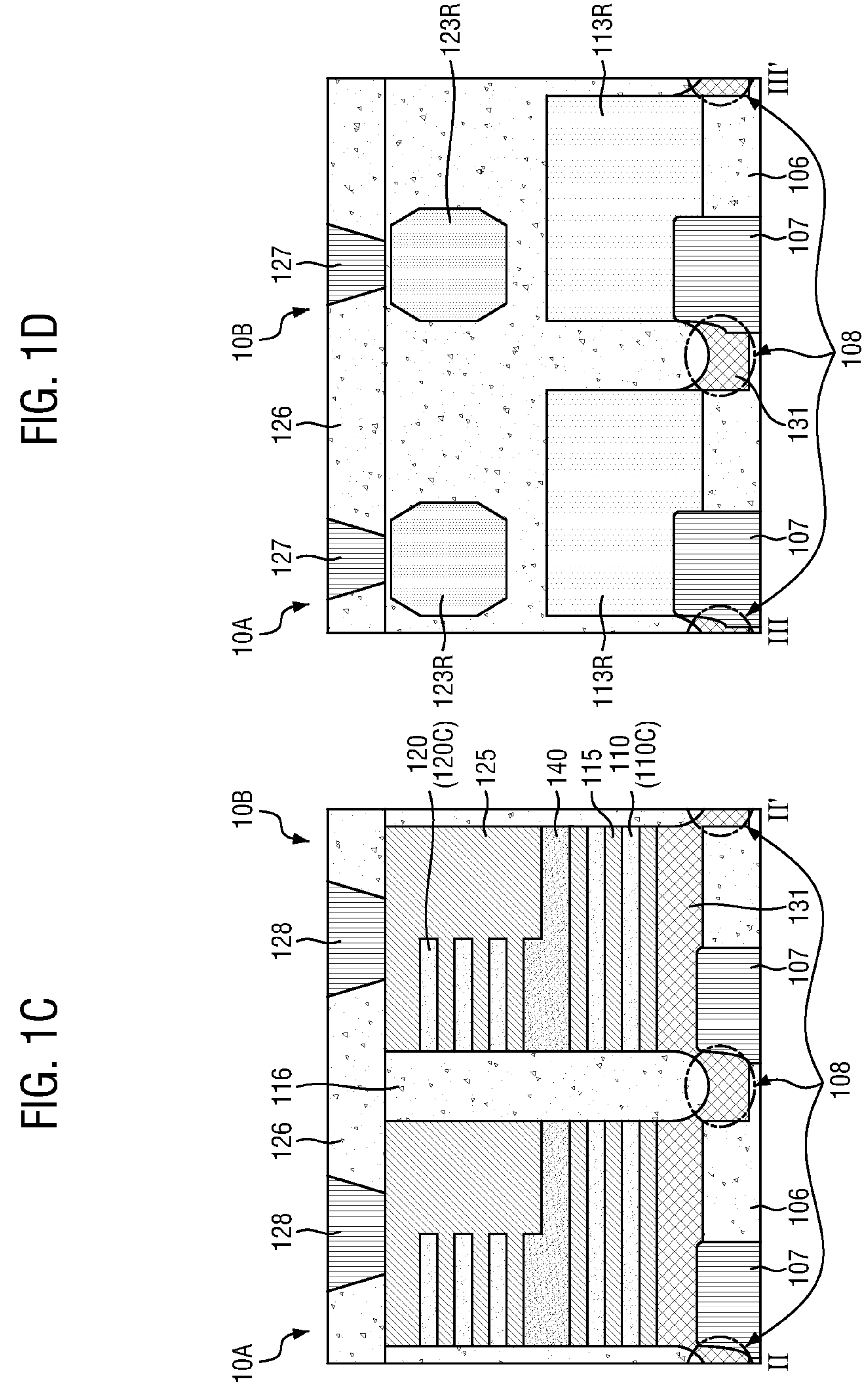
FIG. 1C illustrates a cross-section view of the semiconductor device of FIG. 1A along a line II-II' shown in FIG. 1A.
FIG. 1D illustrates a cross-section view of the semiconductor device of FIG. 1A along a line III-III' shown in FIG. 1A.

The embodiments of the disclosure described herein are example embodiments, and thus, the disclosure is not limited thereto, and may be realized in various other forms. Each of the embodiments provided herein is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it is to be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It is to be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the drawings. It is to be understood that the spatially relative terms are intended to encompass different orientations of a semiconductor device in use or operation in addition to the orientation depicted in the drawings. For example, if the semiconductor device in the drawings is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "lower" element and an "upper" element" may be an "upper" element and a "lower" element when a device or structure including these elements are differently oriented. Thus, in the descriptions herebelow, the "lower" element and the "upper" element may also be referred to as a "$1^{st}$" element or a "$2^{nd}$" element, respectively, as long as their structural relationship is clearly understood in the context of the descriptions. Similarly, the terms a "left" element and a "right" element may be respectively referred to as a "$1^{st}$" element and a "$2^{nd}$" element with necessary descriptions to distinguish the two elements.

It is to be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element described in one embodiment herein could be termed a $2^{nd}$ element in another embodiment or claims of the disclosure without departing from the teachings of the disclosure.

As used herein, expressions such as "at least one of," when preceding a list of elements, modify the entire list of elements and do not modify the individual elements of the list. For example, the expression, "at least one of a, b and c,"

should be understood as including only a, only b, only c, both a and b, both a and c, both b and c, or all of a, b and c. Herein, when a term "same" is used to compare a dimension of two or more elements, the term may cover a "substantially same" dimension.

It is to be understood that various elements shown in the drawings are schematic illustrations not drawn to scale. In addition, for ease of explanation, one or more elements of a type commonly used to form semiconductor devices may not be explicitly shown in the drawings without implying these elements are omitted from actual semiconductor devices. Furthermore, it is to be understood that the embodiments described herein are not limited to particular materials, features, and manufacturing steps or operations shown or described herein. Thus, with respect to semiconductor manufacturing steps, the descriptions provided herein are not intended to include all steps that may be required to form an actual semiconductor device. For example, the commonly-used steps such as planarizing, cleaning, or annealing steps may not be described herein for the sake of brevity. It is to be also understood that, even if a certain step or operation is described later than another step or operation, the step or operation may be performed later than the other step or operation unless the other step or operation is described as being performed after the step or operation.

Many embodiments are described herein with reference to cross-sectional views that are schematic illustrations of the embodiments. As such, variations from the shapes of the illustrations as a result, for example, of manufacturing techniques and/or tolerances, are to be expected. Thus, the embodiments should not be construed as limited to the particular shapes of elements illustrated herein but are to include deviations in shapes that result, for example, from manufacturing. Various elements illustrated in the drawings are schematic in nature and their shapes are not intended to illustrate the actual shape of an element of a semiconductor device and are not intended to limit the scope of the disclosure.

Moreover, functions, materials and shapes of conventional elements of semiconductor devices including a semiconductor device may not be described when these elements are not related to the novel features of the embodiments or not necessary in describing the same.

Herebelow, various embodiments of the disclosure will be described in reference to FIGS. 1A-1D to 16.

FIG. 1A illustrates a top plan view of a semiconductor device a plurality of 3DSFETs in which self-aligned backside contact plugs are formed using contact isolation layers, according to an embodiment, FIG. 1B illustrates a cross-section view of the semiconductor device of FIG. 1A along a line I-I' shown in FIG. 1A, FIG. 1C illustrates a cross-section view of the semiconductor device of FIG. 1A along a line II-II' shown in FIG. 1A, and FIG. 1D illustrates a cross-section view of the semiconductor device of FIG. 1A along a line III-III' shown in FIG. 1A.

Referring to FIGS. 1A-1D, a semiconductor device 10 may include a $1^{st}$ 3DSFET 10A and a $2^{nd}$ 3DSFET 20A arranged in a $2^{nd}$ direction D2, which is a channel-width direction, intersecting a $1^{st}$ direction D1, which is a channel-length direction in which a current flows between source/drain regions. The $1^{st}$ direction D1 may also refer to a width direction of a source/drain region. Although FIGS. 1A and 1B show only two 3DSFETs, there may be more or less than five 3DSFETs arranged in the $1^{st}$ direction D1 and/or the $2^{nd}$ direction D2 in the semiconductor device 10.

Each of the two 3DSFET 10*a* and 10B may include a lower field-effect transistor 100L at a lower stack and an upper field-effect transistor 100U at an upper stack. The lower field-effect transistor 100L may include a left lower source/drain region 113L and a right lower source/drain region 113R (collectively referred to as "lower source/drain regions 113") connected to each other through a low channel structure 110 which is surrounded by a lower gate structure 115. The upper field-effect transistor 100U may include a left upper source/drain region 123L and a right upper source/drain region 123R (collectively referred to as "upper source/drain regions 123") connected to each other through an upper channel structure 120 surrounded by an upper gate structure 125. The lower source/drain regions 113 and the upper source/drain regions 123 may be isolated from each other through a $1^{st}$ isolation structure 116 which may be formed of a dielectric material having a dielectric constant κ lower than 3.9. For example, the dielectric material may include silicon oxide (e.g., SiO, $SiO_2$, etc.).

The lower channel structure 110 may include a plurality of lower channel layers 110C, and the upper channel structure 120 includes a plurality of upper channel layers 120C. The channel layers 110C and 120*c* may be formed of a material such as silicon (Si), for example. The source/drain regions 113 and 123 may be formed of silicon or silicon germanium (SiGe) doped with impurities such as boron (B), gallium (Ga) and indium (In) for p-type, and phosphorus (P), arsenic (As) and antimony (Sb) for n-type.

The upper channel layers 120C of the upper channel structure 120 may have a shorter width than the lower channel layers 110C of the lower channel structure 110. Accordingly, a width W2 of each of the upper source/drain regions 123 epitaxially grown from the upper channel layers 120C may have shorter than a width W1 of each of the lower source/drain regions 113 epitaxially grown from the lower channel layers 110C. As the upper channel structure 120 is formed to have a shorter width than the lower channel structure 110, the upper channel structure 120 may be formed to have a greater number of channel layers than the lower channel structure 110 at least to make the two channel structures 110 and 120 have a same or substantially same effective channel width $W_{eff}$. The number of channel layers of the upper channel structure 120 and the lower channel structure 110 may not be limited to three and two, respectively, as shown in FIGS. 1B and 1C.

The gate structures 115 and 125 may each include a gate dielectric layer, a work-function layer and a gate electrode. The gate dielectric layer formed on each of the channel layers 110C and 120C may include a dielectric material having a dielectric constant κ greater than 10, not being limited thereto. For example, the dielectric material for the gate dielectric layer may include hafnium oxide (e.g., $HfO_2$). The work-function layer formed on the gate dielectric layer may include a material such as titanium (Ti), tantalum (Ta), etc., not being limited thereto, which may differ for a p-type field-effect transistor and an n-type field-effect transistor. The gate electrode surrounding the work-function layer may include a metal or a metal compound such as copper (Cu), aluminum (Al), tungsten (W), ruthenium (Ru), molybdenum (Mo), etc., not being limited thereto. The lower gate structure 115 may be separated from the upper gate structure 125 though a gate separation layer 140 which may be formed of a dielectric material such as silicon nitride (e.g., SiN, $Si_3N_4$, etc.) or silicon oxide (e.g., SiO, $SiO_2$, etc.). Each of the gate structures 115 and 125 may be isolated from the source/drain regions 113 and 123 though inner spacers 141.

On each of the upper gate structures 125 may be formed a gate contact plug 128 which may connect the upper gate structure 125 to another circuit element of the semiconductor device 10. The gate contact plug 128 may be a common gate plug to receive a same gate input signal for the lower field-effect transistor 100L and the upper field-effect transistor 100U, for example.

On the upper source/drain regions 123 of each of the $1^{st}$ 3DSFET 10A and the $2^{nd}$ 3DSFET 10B may be formed upper contact plugs 127 which may connect the upper source/drain regions 123 to a voltage source or another circuit element through BEOL metal lines formed thereabove, respectively. Each of the upper contact plugs 127 may be formed on a top surface of the upper source/drain region 123. The upper contact plugs 127 may be isolated from each other through a $2^{nd}$ isolation structure 126, which may be formed of a material the same as or similar to the material forming the $1^{st}$ isolation structure 116. The $2^{nd}$ isolation structure 126 may be isolated from the upper gate structure 125 though a gate spacer 142.

On the left lower source/drain region 113L of each of the $1^{st}$ 3DSFET 10A and the $2^{nd}$ 3DSFET 10B may be formed a lower contact plugs 117 which may connect the left lower source/drain region 123 to a voltage source or another circuit element through a BEOL metal line formed thereabove, respectively. The lower contact plug 117 may be formed on a top surface of the left lower source/drain region 113L through a non-overlapping region above the left lower source/drain region 113L and at a side of the right upper source/drain region 123L. The lower contact plugs 117 may also be isolated from each other through the $1^{st}$ isolation structure 116 and the $2^{nd}$ isolation structure 126.

However, on the right lower source/drain region 113R of each of the $1^{st}$ 3DSFET 10A and the $2^{nd}$ 3DSFET 10B may be formed a backside contact plug 107 which may connect the right lower source/drain region 113R to a voltage source or another circuit element through a backside metal line formed therebelow, respectively. The backside contact plug 107 may be formed on a bottom surface of the right lower source/drain region 113R. The backside contact plugs 107 may be isolated from each other through a $3^{rd}$ isolation structure 106, which may be formed of a material the same as or similar to the material forming the $1^{st}$ isolation structure 116.

According to an embodiment, the backside contact plug 107 formed on the right lower source/drain region 113R may be laterally extended in the $1^{st}$ direction D1 to a region below the lower gate structure 115, and laterally surrounded by the $3^{rd}$ isolation structure 126. However, this backside contact plug 107 may be isolated from the lower gate structure 115 by a contact isolation layer 131 which may be formed below a bottom surface of the lower gate structure 115, according to an embodiment. The contact isolation structure 131 may be formed of a material different from the material forming the isolation structures 106, 116 and 126, according to an embodiment. The material forming the contact isolation structure 131 may include silicon nitride (e.g., SiN, $Si_3N_4$, etc.), for example.

The contact isolation layer 131 along with the $1^{st}$ isolation structure 116 thereabove and the $2^{nd}$ isolation structure 106 therebelow may also isolate the $1^{st}$ 3DSFET 10A and the $2^{nd}$ 3DSFET 10B from each other in the $1^{st}$ direction D1. According to an embodiment, the contact isolation layer 131 formed below the lower gate structures 115 of the 3DSFETs 10A and 10B may laterally extended in the $2^{nd}$ direction D2 to be also formed in a shallow trench isolation (STI) region 108 between two adjacent 3DSFETs including between the 3DSFETs 10A and 10B as shown in FIGS. 1C and 1D. As known in the art, the STI region 108 in a related-art semiconductor device is formed of a material such as silicon oxide (e.g., $SiO_2$) to isolate an active region and a source/drain region of a field-effect transistor from those of an adjacent field-effect transistor or an adjacent passive device.

As shown in FIGS. 1C and 1D, a bottom surface of the contact isolation layer 131 formed in the STI region 108 may be at a level lower than a bottom surface of the contact isolation layer 131 formed below the bottom surface of the lower gate structure 115 as well as a bottom surface of the right lower source/drain region 113R. The contact isolation layer 131 may isolate two active regions below the lower gate structures 115 of the two 3DSFETs 10A and 10B from each other, and the two right lower source/drain regions 113R of the two 3DSFETs 10A and 10B from each other.

According to an embodiment, the backside contact plug 107 may take a self-aligned form at one side thereof which contacts the contact isolation layer 131 at or near the STI region 108, as shown in FIGS. 1C and 1D. For example, the one side of the backside contact plug 107 at or near the STI region 108 may have a dented or distorted form with a positive slope because of the contact isolation layer 131, and a portion of the backside contact plug 107 may be extended to a region below the contact isolation layer 131 at the STI region 108 in the $3^{rd}$ isolation structure 106. The self-aligned form of the backside contact plug 107 may be further described later in reference to FIGS. 13A and 13B.

Due to the contact isolation layer 131, the backside contact plug 107 may be formed to be connected to a lower source/drain region 113 with a reduced risk of misalignment with the lower gate structure 115. Further, the contact isolation layer 131 may enable the backside contact plug 107 to have an increased contact area on the lower source/drain region 113 to reduce a contact resistance, thereby improving performance of each of the 3DSFETs 10A and 10B.

Herebelow, a process of manufacturing the semiconductor device 10 shown in FIGS. 1A-1D in reference to FIGS. 2 to 14A-14B.

FIGS. 2 to 14A-14B illustrate cross-section view of intermediate semiconductor devices in a channel-width direction after respective operations the process of manufacturing the semiconductor device 10 shown in FIGS. 1A-1D are performed, according to embodiments. Each of FIGS. 2-14A-14BF corresponds to FIG. 1C, and each of FIGS. 2G-2I corresponds to FIGS. 1C and 1D.

As each of the intermediate semiconductor devices shown in FIGS. 2 to 14A-14H is a base structure from which the semiconductor device 10 is manufactured, elements the same as or similar to the elements included in the semiconductor device 10 may be included in one or more of the intermediate semiconductor devices described herebelow with the same reference numbers. Thus, duplicate descriptions thereof may be omitted herebelow.

Figures 2, 3:
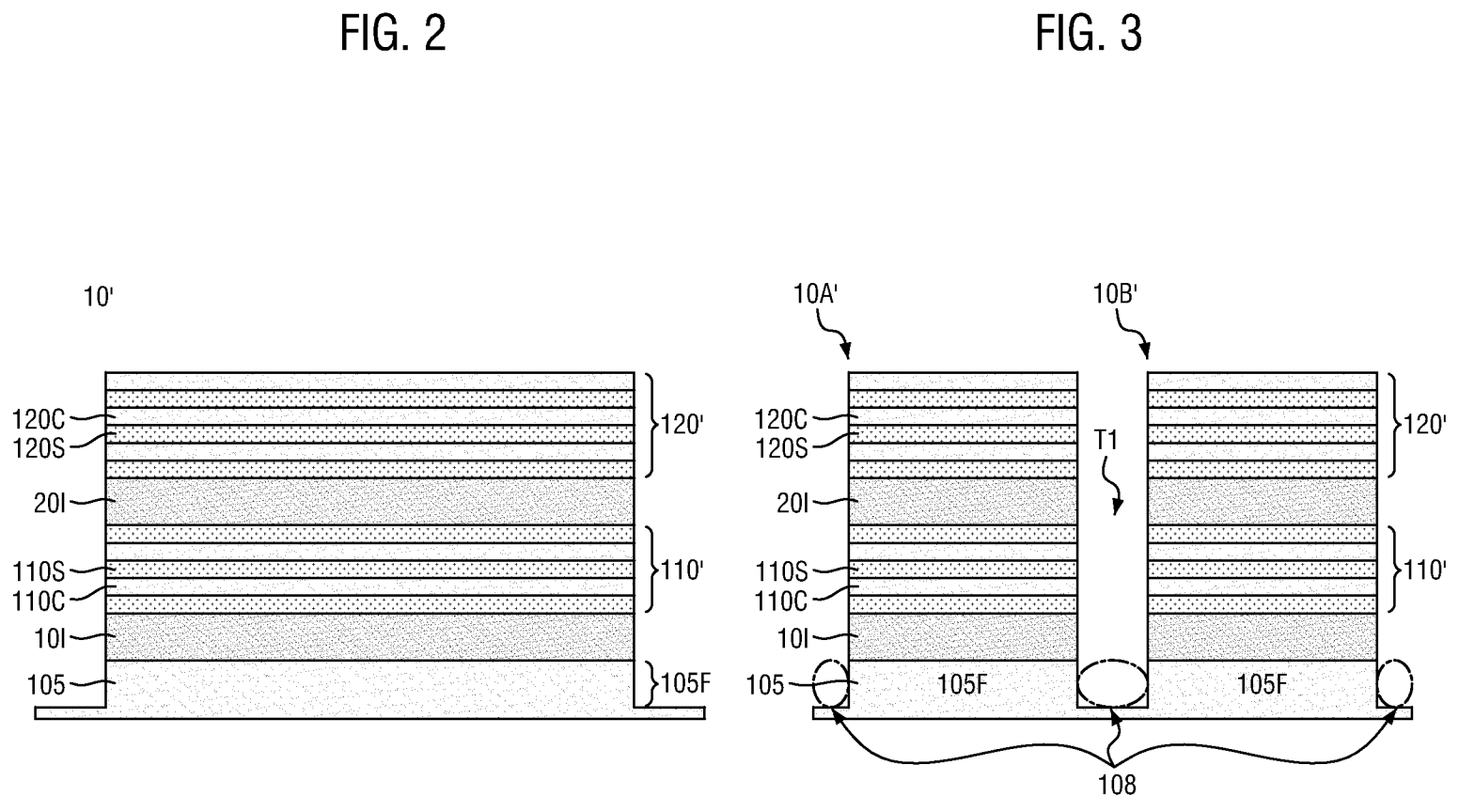

FIG. 2 illustrates a nanosheet stack 10' including a plurality of nanosheet layers formed on an active pattern 105F of a substrate 105, according to an embodiment.

Referring to FIG. 2, the nanosheet stack 10' may include a $1^{st}$ sacrificial structure 10I, a lower channel stack 110', a $2^{nd}$ sacrificial structure 201 and an upper channel stack 120' in this order on the substrate 105. Each of these structures 10I, 110', 201' and 120' may be formed of a plurality of semiconductor nanosheet layers (hereafter referred to as "nanosheet layers") that include a plurality of sacrificial layers and channel layers as described below.

In the embodiments presented herein, the sacrificial structures and sacrificial layers are referred to as such because, these elements, unlike the channel layers are to be removed and replaced by other elements in later steps of manufacturing the semiconductor device 10 in the present embodiments.

According to an embodiment, the nanosheet stack 10' shown in FIG. 2 may be formed by epitaxially growing nanosheet layers one layer and then next in the following order. The 1st sacrificial structure 10I may be grown from an active region 105F of the substrate 105. Three lower sacrificial layers 110S and two lower channel layers 110C may be alternately grown from the 1st sacrificial structure 10I to form the lower channel stack 110'. The 2nd sacrificial structure 201 may be grown from the lower channel stack 110'. Three upper sacrificial layers 120S and three upper channel layers 120C may be grown from the 2nd sacrificial structure 201 to form the upper channel stack 120'. However, the above number of the nanosheet layers epitaxially grown as shown in FIG. 2 is not limited thereto as long as the upper channel stack 120' has more channel layers than the lower channel stack 110' for the reason described above in reference to FIGS. 1A-1D.

The substrate 105 may be a silicon (Si) substrate although it may include other materials such as silicon germanium (SiGe), silicon carbide (SiC), not being limited thereto. Each of the sacrificial layers 110S and 120S may include a material such as silicon-germanium (SiGe), and each of the channel layers 110C and 120C may include a material such as silicon (Si). A Ge concentration of each of the sacrificial SiGe layers may be low, for example, 25%, not being limited thereto. The 1st sacrificial structure 10I and the 2nd sacrificial structure 201 may each include a material such as silicon germanium (SiGe) having a higher germanium (Ge) concentration, for example, 50%, not being limited thereto as long as these sacrificial structures 10I and 201 have an enough etch selectivity with respect to the sacrificial layers 110S and 120S including a lower germanium concentration than the sacrificial structures 10I and 201.

FIG. 3 illustrates a 1st nanosheet stack 10A' and a 2nd nanosheet stack 10B' separated from the nanosheet stack 10' shown in FIG. 2, according to an embodiment.

Referring to FIG. 3, the nanosheet stack 10' shown in FIG. 2 may be separated into a plurality of nanosheet stacks including the 1st nanosheet stack 10A' and a 2nd nanosheet stack 10B' which are to form the 1st 3DSFET 10A and the 2nd 3DSFET 10B shown in FIGS. 1A-1D. It is to be understood that only two nanosheet stacks 10A' and 10B' are shown in FIG. 3 to simplify the description of the embodiments.

The nanosheet stack 10' may be separated into the nanosheet stacks 10A' and 10B' through, for example, a photolithography and masking operation, by which a trench T1 including the shallow trench isolation (STI) region 108 may be formed between the two nanosheet stacks 10A' and 10B'. The STI region 108 to isolate the two 3DSFETs 10A and 10B when completed may be formed below a top surface of the substrate 105.

Figures 4, 5:
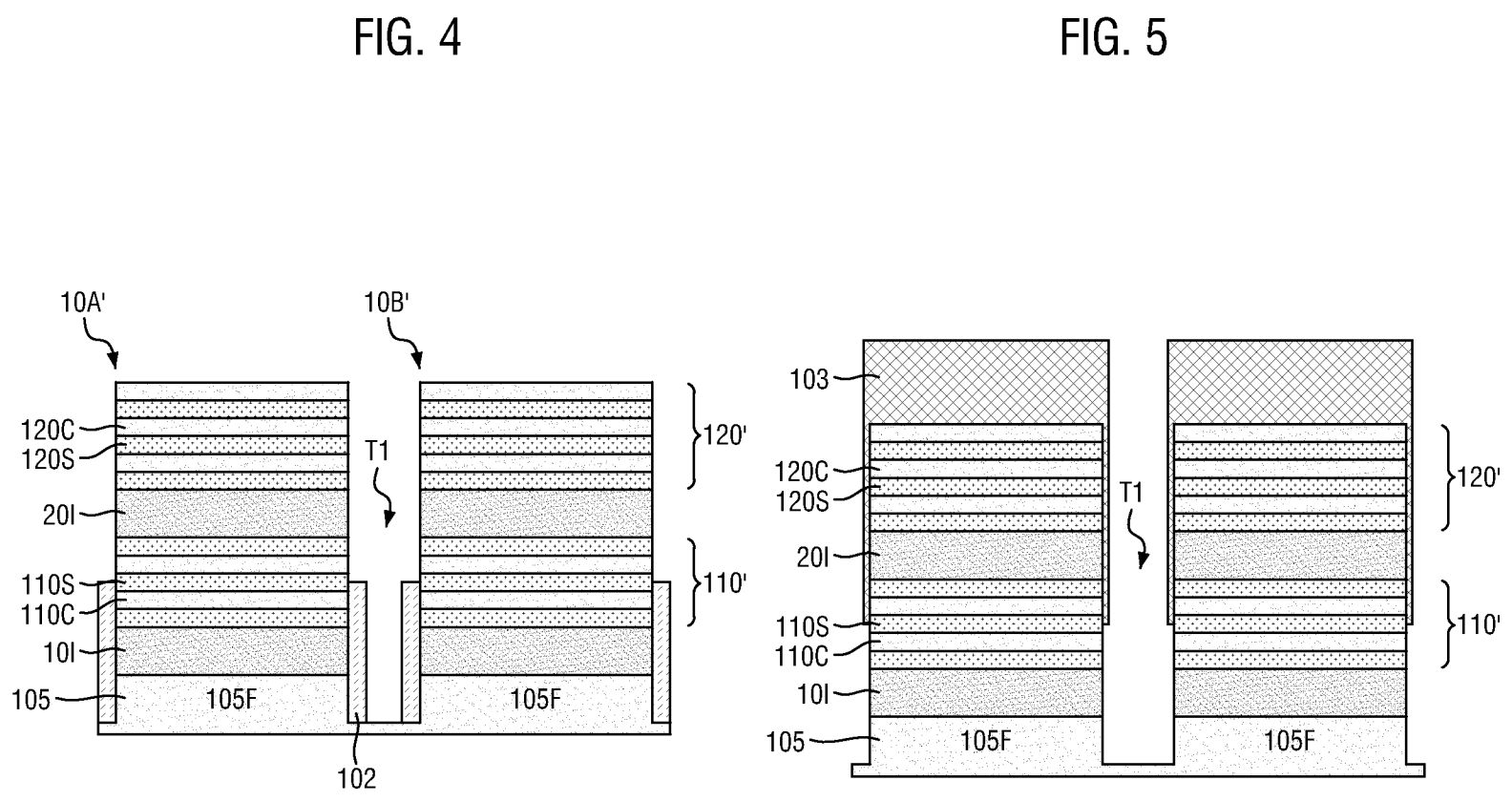

FIG. 4 illustrates that spin-on-glass (SOG) 102 is formed at side surfaces of each of the nanosheet stacks 10A' and 10B' obtained in the previous step, according to an embodiment.

Referring to FIG. 4, the SOG 102 may be dispensed at the side surfaces of each of the nanosheet stacks 10A' and 10B' and the active region 105F of the substrate 105 therebelow to a level above at least a top surface of the 1st sacrificial structure 10I so that the 1st sacrificial structure 10I can be covered by the SOG 102. The SOG 102 may be formed of a liquid silicate-based material.

FIG. 5 illustrates that a blocking spacer 103 is formed to surround each of the nanosheet stacks 10A' and 10B' based on the SOG 102, and then, the SOG 102 may be removed from each of the nanosheet stacks 10A' and 10B', according to an embodiment.

The blocking spacer 103 may be formed on a top surface and the side surfaces of each of the nanosheet stacks 10A' and 10B' to a level down to top surface of the SOG 102 formed on the side surfaces of each of the nanosheet stacks 10A' and 10B'. The formation of the blocking spacer 103 on the nanosheet stacks 10A' and 10B' may be performed through, for example, atomic layer deposition (ALD), not being limited thereto.

After the blocking spacer 103 is formed, the SOG 102 may be stripped or etched away through, for example, dry etching or wet etching, not being limited thereto, to expose side surfaces of at least the 1st sacrificial structure 10I. Here, depending on the level of the SOG 102 formed at the side surfaces of each of the nanosheet stacks 10A' and 10B', at least one lower sacrificial layer 110S and at least one lower channel layer 110C may also be exposed when the SOG 102 is removed.

Figures 6, 7:
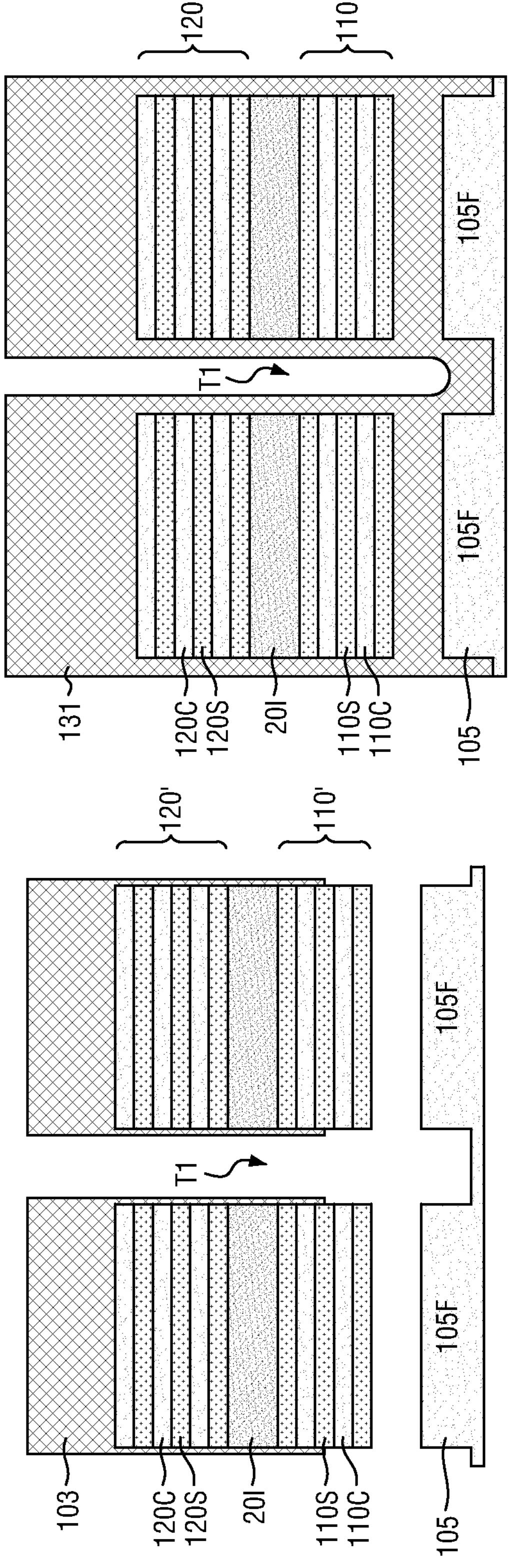

FIG. 6 illustrates that the 1st sacrificial structure 10I is removed from each of the nanosheet stacks 10A' and 10B' with the blocking spacer 103 thereon, according to an embodiment.

The sacrificial structure 10I may be removed through, for example, wet etching using a selected wet etchant such as a mixture of hydrofluoric acid (HF) and nitric acid (HNO3), not being limited thereto, which may selectively etch silicon germanium (SiGe) with a high germanium (GE) concentration against silicon germanium (SiGe) with a low germanium (GE) concentration as well as silicon nitride and silicon.

As described above, the 1st sacrificial structure 10I may include silicon germanium (SiGe) having a higher germanium (Ge) concentration, for example, 50% while the sacrificial layers 110S and 120S may include silicon germanium (SiGe) with a low germanium (GE) concentration, for example, 25%. Thus, based on the blocking spacer 103, the sacrificial structure 10I may be selectively etched by wet etching using the selected wet etchant while at least one lower sacrificial layer 110S and at least one lower channel layer 110C that may be exposed at their side surfaces by removing the SOG 102 in the previous step may tolerate the wet etching.

It is to be understood here that the 1st sacrificial structure 10I may be removed in this step to provide a space in which the contact isolation layer 131 shown in FIGS. 1B-1D is to be formed in a later step.

FIG. 7 illustrates that a contact isolation structure 131' is formed on the nanosheet stacks 10A' and 10B' from each of which the 1st sacrificial structure 10I is removed, according to an embodiment.

The contact isolation structure 131' may be formed on the blocking spacer 103 remaining after being used for removing the 1st sacrificial structure 10I in the previous step through, for example, physical vapor deposition (PVD), chemical vapor deposition (CVD), plasma enhanced CVD (PECVD), radio-frequency CVD (RFCVD), atomic layer deposition (ALD), or the like, not being limited thereto. Alternatively, the contact isolation structure 131' may be formed after the blocking layer 103 is removed from the nanosheet stacks 10A' and 10B' obtained in the previous step.

The contact isolation structure 131' may be formed to surround the nanosheet stacks 10A' and 10B', and fill in the space provided by the removal of the 1st sacrificial structure 10I, that is, between the substrate 105 and a lower-most sacrificial layer 110S of the lower channel stack 110'. The contact isolation structure 131' may also be formed in the STI region 108 between the two nanosheet stacks 10A' and 10B'

The contact isolation structure 131' is a base structure of the contact isolation layer 131 shown in FIGS. 1B-1D. The contact isolation structure 131' may be formed of a material such as silicon nitride (e.g., SiN, $Si_3N_4$, etc.), which may be the same as or similar to the material forming the blocking spacer 103 but different from the material forming the 1st isolation structure 116, according to an embodiment.

Figures 8, 9:
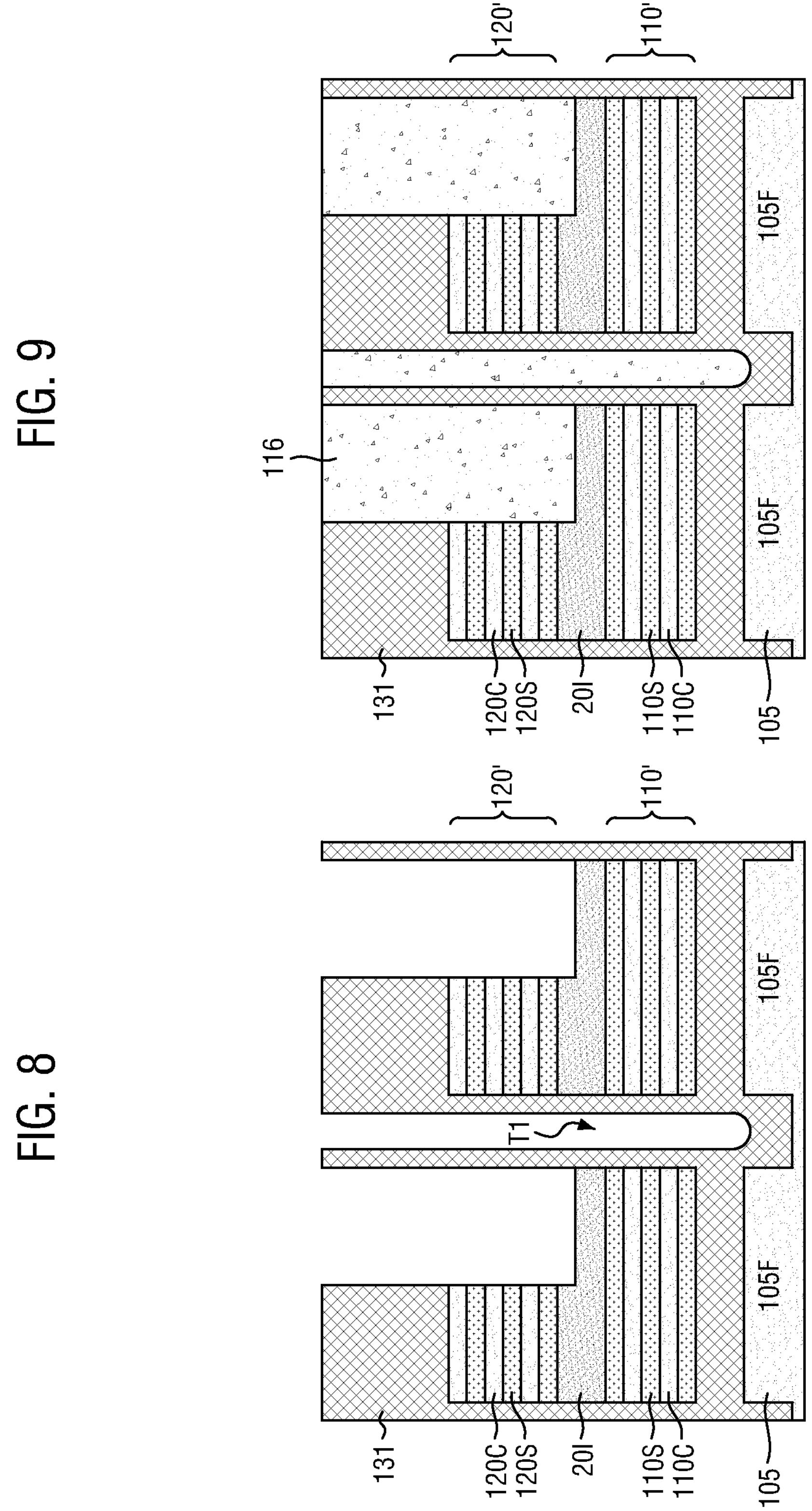

FIG. 8 illustrates that the upper channel stack 120' of each of the nanosheet stacks 10A' and 10B' is patterned such that the upper channel stack 120' has a shorter width than the lower channel stack 110', according to an embodiment.

The upper channel stack 120' may be patterned to have a shorter width than the lower channel stack 110' so that the upper field-effect transistor 100U to be formed from the upper channel stack 120' may have a shorter-width channel structure than the lower field-effect transistor 100L in each of the 3DSFETs 10A and 10B as described in reference to FIGS. 1A-1D.

The patterning operation performed on the nanosheet stacks 10A' and 10B' may be another photolithography and masking operation including dry etching, for example.

FIG. 9 illustrates that a 1st isolation structure 116 is formed on an intermediate semiconductor device including the nanosheet stacks 10A' and 10B' obtained in the previous step to isolate various elements of the intermediate semiconductor device, according to an embodiment.

Before the 1st isolation structure 116 is formed in this step and after the nanosheet stacks 10A' and 10B' are patterned in the previous step, the lower source/drain regions 113 and the upper source/drain regions 123 of each of the 3DSFETs 10A and 10B shown in FIGS. 1A-1D may be epitaxially grown from the lower channel stack 110' and the upper channel stack 120', respectively. Thus, the 1st isolation structure 116 may be formed to isolate at least the source/drain regions 113 and 123 from each other.

As described in refer to FIGS. 1A-1D, the 1st isolation structure 116 may be formed of a dielectric material having a dielectric constant κ lower than 3.9. For example, the dielectric material may include silicon oxide (e.g., SiO, $SiO_2$, etc.).

Figure 10:
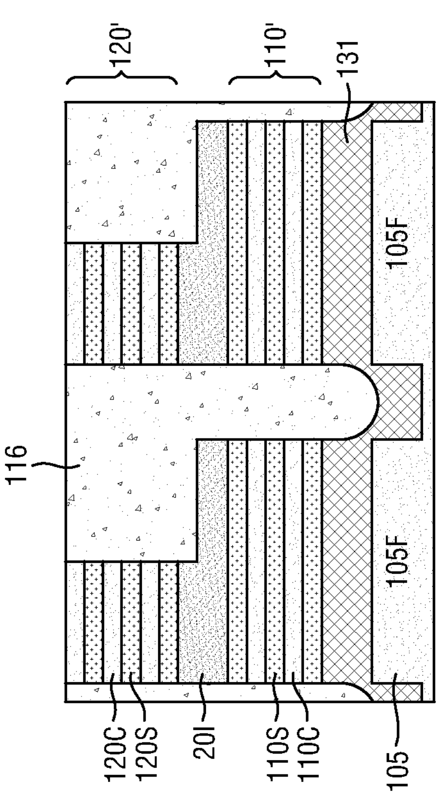

FIG. 10 illustrates that the contact isolation structure 131' formed in the previous step is etched except only portions thereof formed in the STI region 108 and the space between the lower-most sacrificial layer 110S and the active region 105F of the substrate 105 in each of the nanosheet stacks 10A' and 10B', according to an embodiment.

Thus, the contact isolation layer 131 shown in FIGS. 1B-1D may be formed out by this partial etching operation. The partial etching operation performed in this step may be wet etching or dry etching, not being limited thereto. When wet etching is performed to remove part of the contact isolation structure 131' in this step, hot phosphorous may be used as wet etchant to remove the silicon nitride.

Figures 11A, 11B:
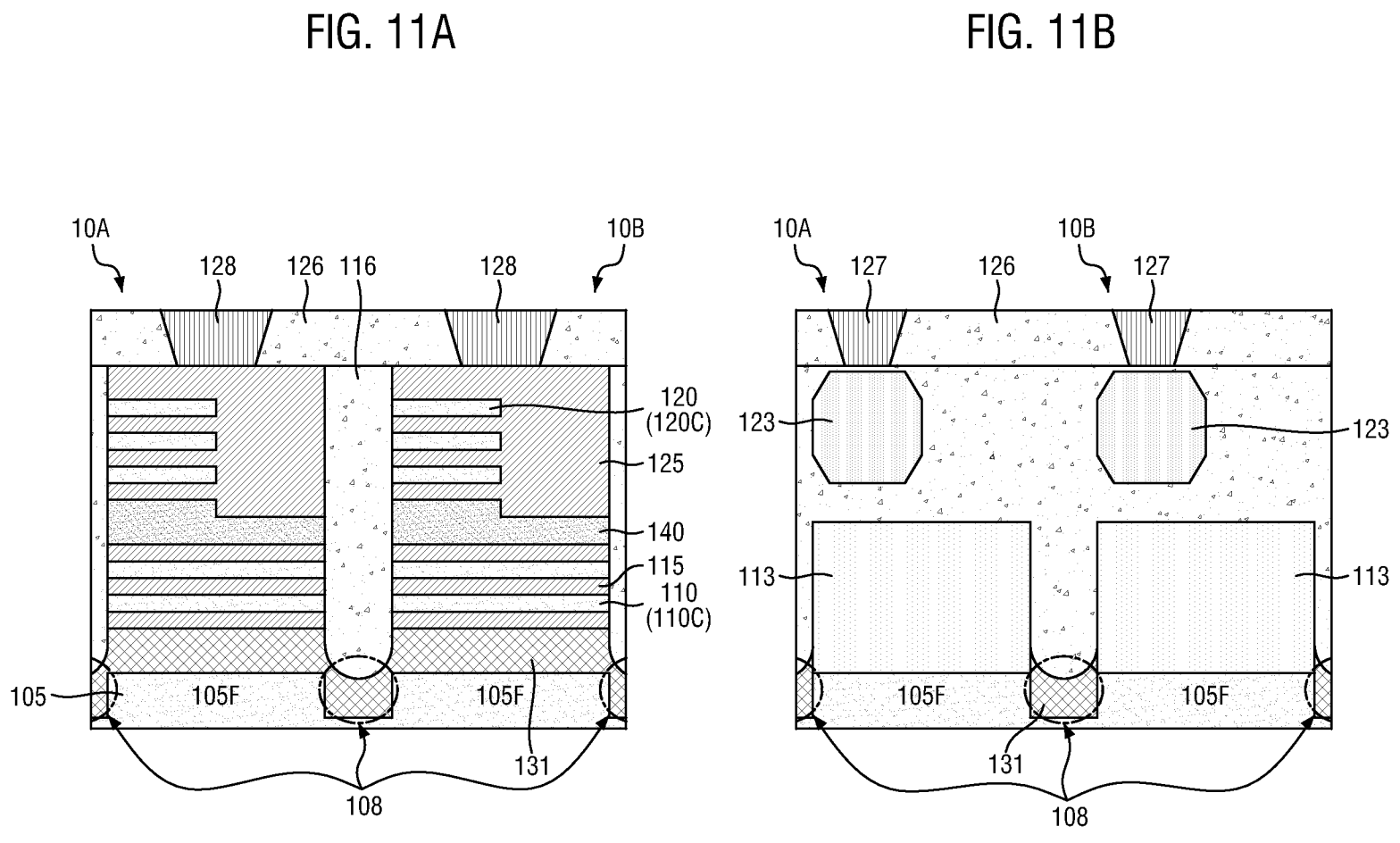

FIGS. 11A and 11B illustrate that the 2nd sacrificial structure 201, the lower sacrificial layers 110S and the upper sacrificial layers 120S are removed and replaced by a gate separation layer 140, a lower gate structure 115 and an upper gate structure 125, respectively, from the nanosheet stacks 10A' and 10B' obtained in the previous step, thereby to form respective 3DSFETs 10A' and 10B', according to an embodiment.

Further, a 2nd isolation structure 126 may be formed above the 3DSFETs 10A and 10B, and a gate contact plug 128 and an upper contact plug 127 may be patterned in the 2nd isolation structure 126 to be connected to top surfaces of the upper gate structure 125 and the upper source/drain region 123, respectively, for each of the 3DSFETs 10A and 10B. The 2nd isolation structure 126 may be formed of a material the same as or similar to that of the 1st isolation structure 116.

The removal operation performed in this step may include a chemical oxide removal (COR) process, for example, not being limited thereto. The gate isolation layer 140 and the gate structures 115 and 125 may be formed through, for example, one or more of physical vapor deposition (PVD), chemical vapor deposition (CVD), plasma enhanced CVD (PECVD), radio-frequency CVD (RFCVD), atomic layer deposition (ALD), etc.

Figures 12A, 12B:
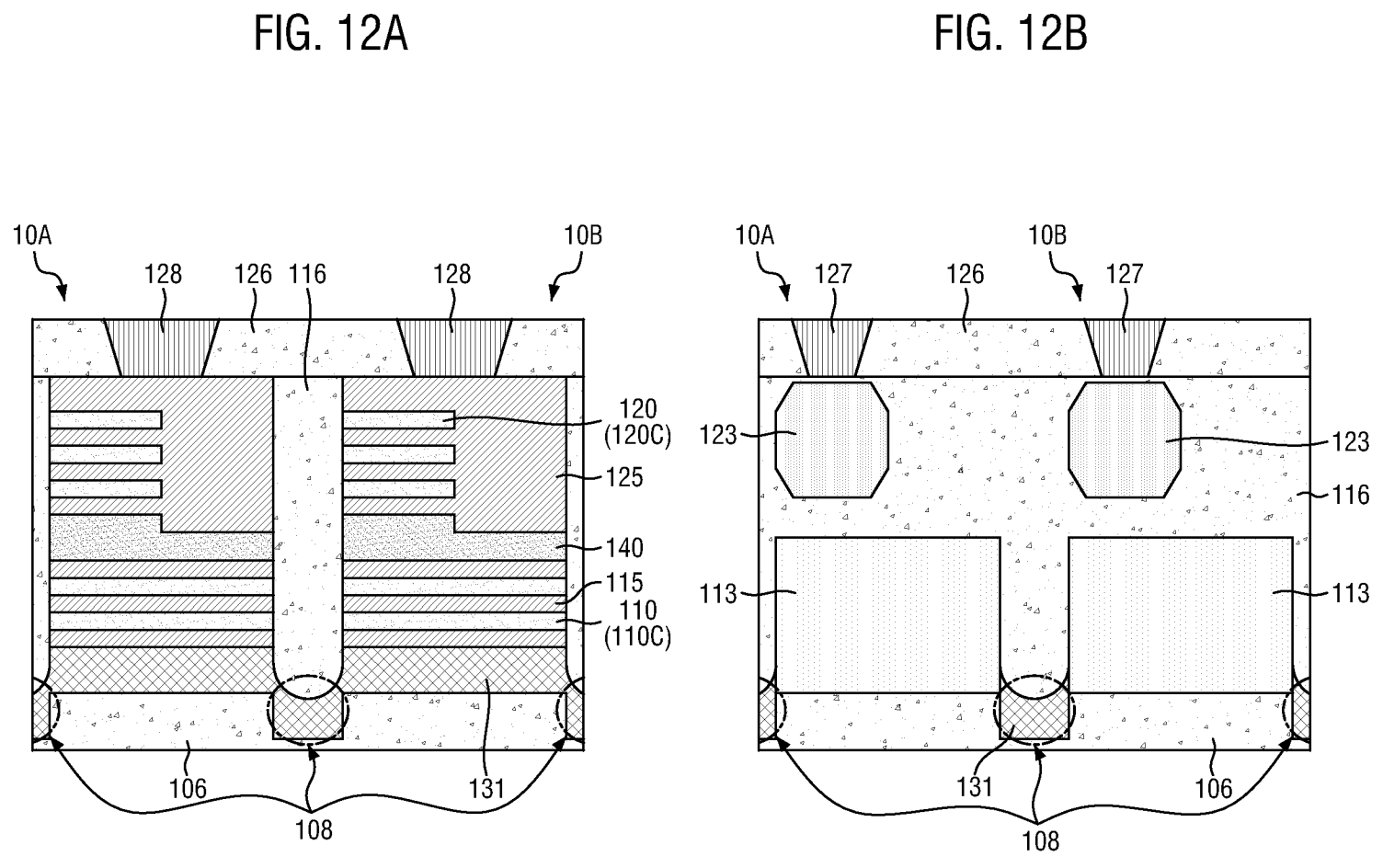

FIGS. 12A and 12B illustrate that the substrate 105 is removed and replaced a 3rd isolation structure 106 which may be formed of a material the same as or similar to the material forming the 1st isolation structure 116 from the intermediate semiconductor device including the 3DSFETs 10A' and 10B' obtained in the previous step, according to an embodiment.

The removal operation in this step may be performed by flipping upside down the intermediate semiconductor device obtained in the previous step through, for example, dry etching or wet etching, not being limited thereto, to remove silicon (Si) forming the substrate 105 against the contact isolation layer 131. The 3rd isolation structure 106 may be formed of a material the same as or similar to that of the 1st isolation structure 116.

Figures 13A, 13B:
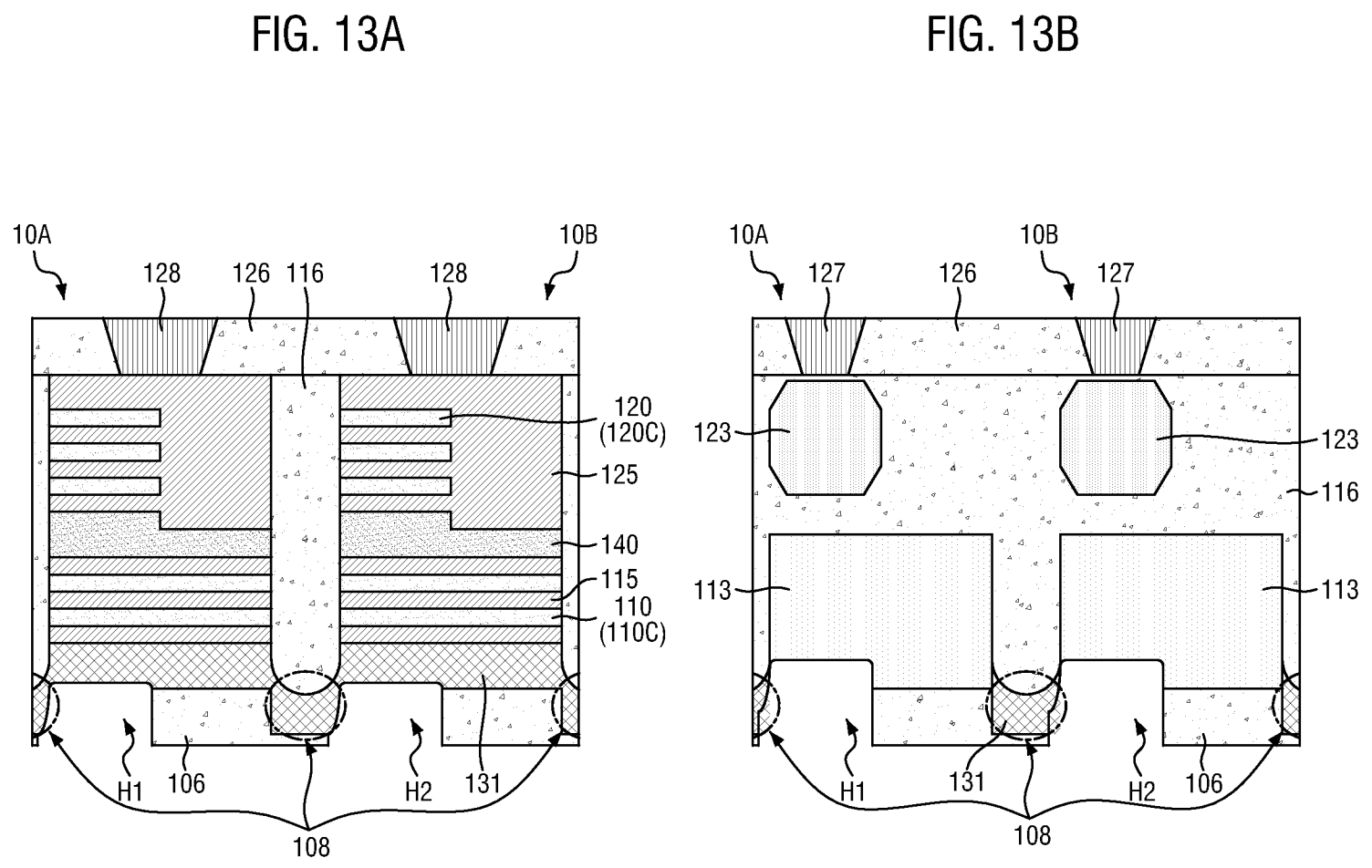

FIGS. 13A and 13B illustrate that contract holes H1 are formed in the 3rd isolation structure 106 to expose the lower source/drain region 113 of each of the 3DSFETs 10A' and 10B', according to an embodiment.

The contact hole H1 may be etched in a self-aligned manner due to the contact isolation layer 131 formed of a material such as silicon nitride (e.g., SiN, $Si_3N_4$, etc.) having a higher etch selectivity and a lower etch rate than the material such as silicon oxide (e.g., SiO, $SiO_2$, etc.) forming the 3rd isolation structure 106. Thus, when the contact hole H1 is formed in the 3rd isolation structure 106 through, for example, plasma dry etching, the 3rd isolation structure 106 formed below the STI region 108 and the contact isolation layer 131 included in the STI region 108 may be etched to have a positive slope.

The contact hole H1 formed below the lower source/drain region 113 may be extend to a region below the lower gate structure 115 in a channel-length direction (1st direction D1) as shown in FIG. 13A. Further, the contact hole H1 may be etched from a bottom surface of the 3rd isolation structure 106 at a position below the STI region, that is, outside a region overlapped by the lower source/drain region 113, the contact hole H1 may be etched toward the lower source/drain region 113 due to the contact isolation layer 131 in the STI region 108. Thus, an increased alignment margin may be obtained due to the contact isolation layer 131.

Figures 14A, 14B:
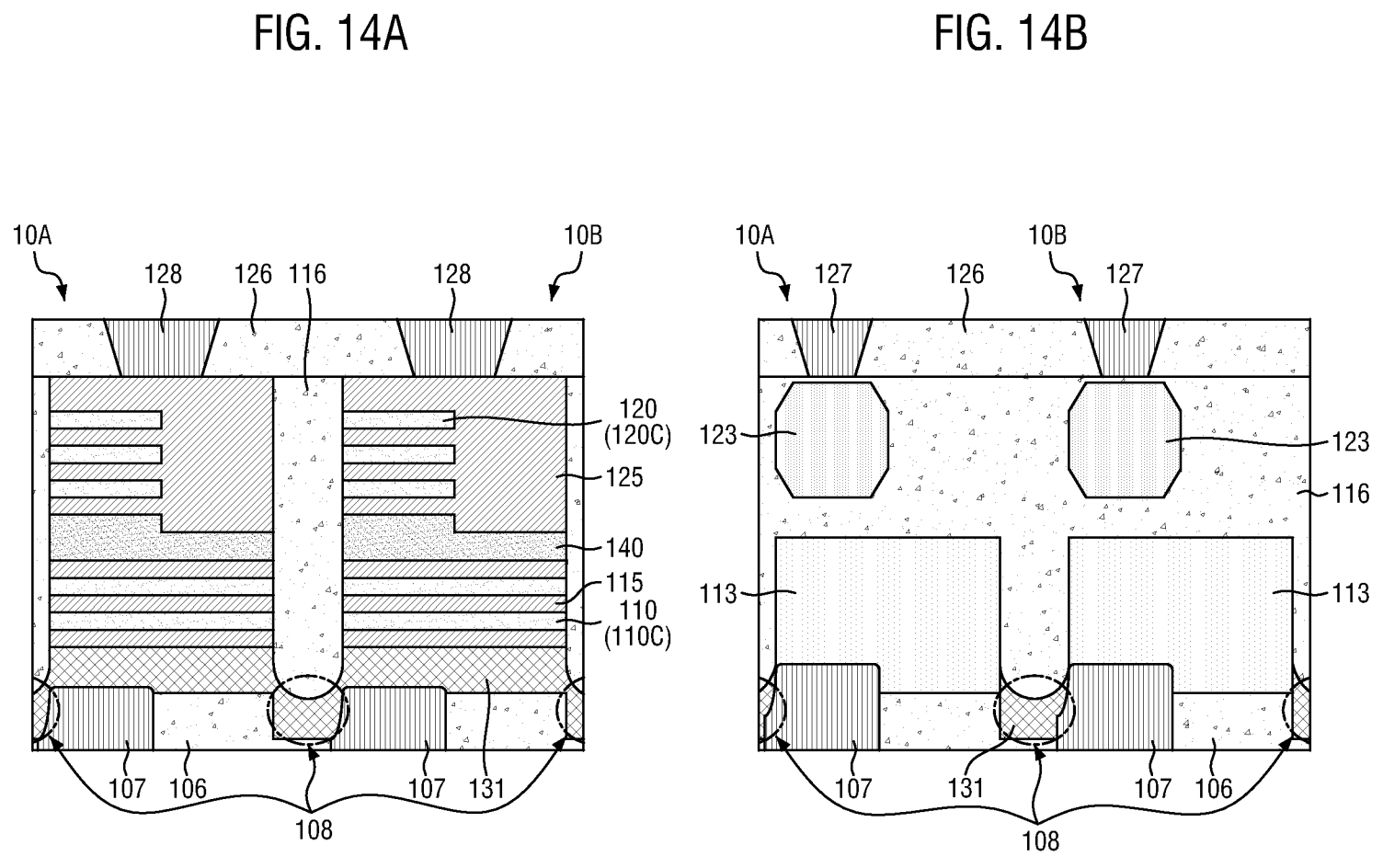

FIGS. 14A and 14B illustrate that a backside contact plug 107 is formed in each of the contact holes H1 formed in the previous step to complete the semiconductor device 10 including the 3DSFETs 10A and 10B shown in FIGS. 1A-1D.

The backside contact plug 107 may connect the lower source/drain region 113 of each of the 3DSFETs 10A and 10B to a voltage source or another circuit element through a backside metal line formed therebelow, respectively. The backside contact plug 107 may be formed to contact a bottom surface of the lower source/drain region 113. The backside contact plugs 107 may be isolated from each other through the 3rd isolation structure 106.

The backside contact plug 107 formed on the bottom surface of the lower source/drain region 113 may be laterally extended in the channel-length direction to the region below the lower gate structure 115, and laterally surrounded by the 3rd isolation structure 126. However, this backside contact plug 107 may be isolated from the lower gate structure 115 by the contact isolation layer 131 which is formed below the bottom surface of the lower gate structure 115.

Moreover, the backside contact plug 107 may take a self-aligned form at one side thereof which contacts the contact isolation layer 131 at or near the STI region 108. For example, the one side of the backside contact plug 107 at or near the STI region 108 may have a dented or distorted form with a positive slope due to the contact isolation layer 131, and a portion of the backside contact plug 107 may be extended to a region below the contact isolation layer 131 at the STI region 108 in the 3rd isolation structure 106.

Figure 15:
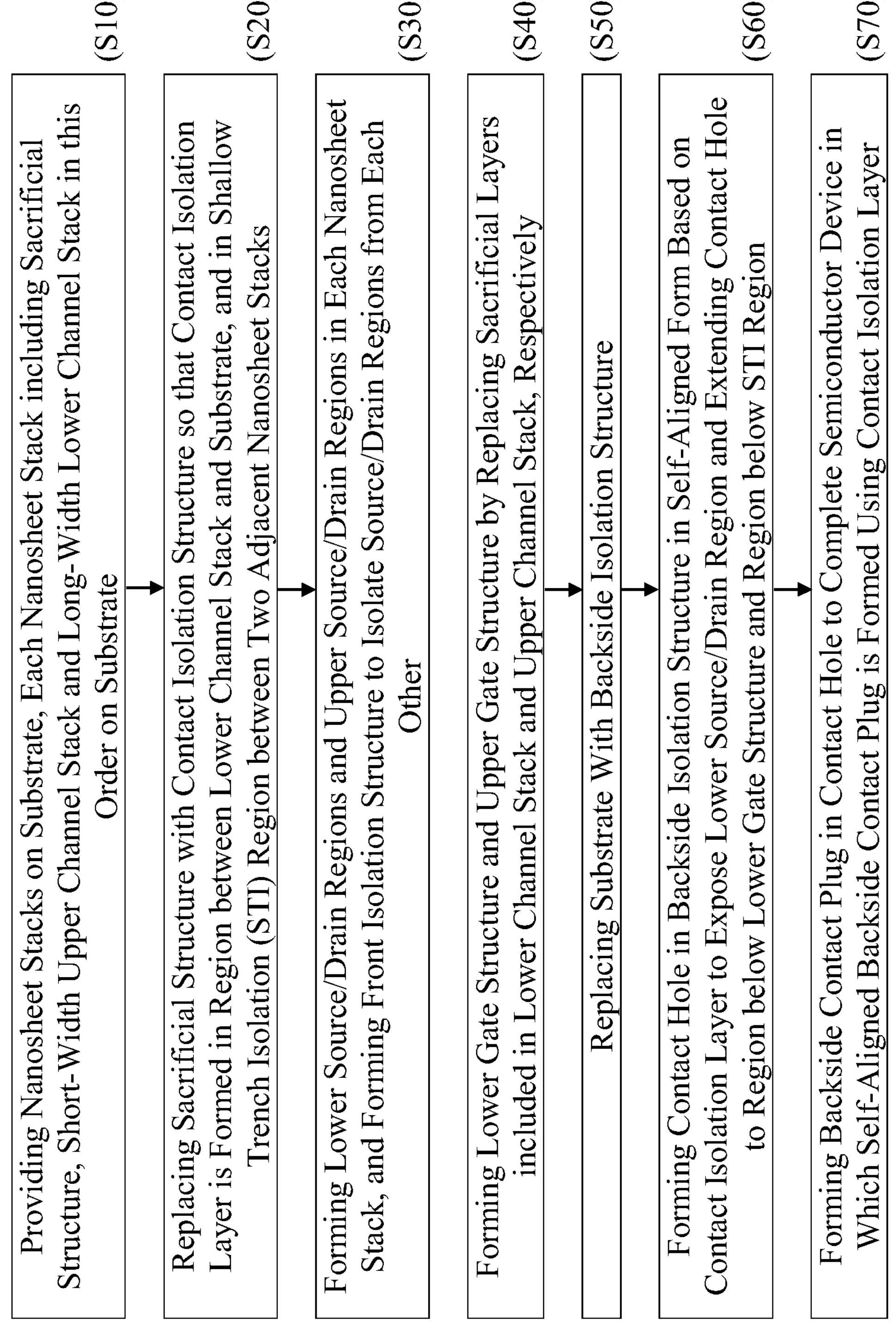
FIG. 15 illustrate a flowchart of a method of manufacturing a semiconductor device including a plurality of 3DSFETs in which self-aligned backside contact plugs are formed using contact isolation layers, according to an embodiment.

FIG. 15 illustrate a flowchart of a method of manufacturing a semiconductor device including a plurality of 3DSFETs in which self-aligned backside contact plugs are formed using contact isolation layers, according to an embodiment. The semiconductor device manufactured based on the flowchart of FIG. 15 may represent the semiconductor device 10 shown in FIGS. 1A-1D to 14.

In operation S10, a plurality of nanosheet stacks may be provided on a substrate, each nanosheet stack including a short-width upper channel stack and a long-width lower channel stack.

Each of the nanosheet stack may include a sacrificial structure, a lower channel stack and an upper channel stack epitaxially grown based on the substrate in this order. The upper channel stack may have a greater number of sacrificial layers and channel layers than the lower channel stack while the upper channel stack may have short-width sacrificial layers and channel layers than the lower channel stack.

In operation S20, the sacrificial structure may be replaced by a contact isolation structure so that a contact isolation layer may be formed in a region between the lower-most sacrificial layer of the lower channel stack and the substrate and in a shallow trench isolation (STI) region between two adjacent nanosheet stacks.

The contact isolation layer representing the contact isolation layer 131 shown in FIGS. 1A-1D may be formed of a material such as silicon nitride.

In operation S30, lower source/drain regions may be formed at both ends of the lower channel stack, and upper source/drain regions may be formed at both ends of the upper channel stack in each of the nanosheet stack. Further, a front isolation structure may be formed on the nanosheet stacks to isolate the source/drain regions from each other.

The front isolation structure may be formed of a material such as silicon oxide, different from the material forming the contact isolation layer in terms of etch electivity and/or etch rate. The front isolation structure may represent the 1st isolation structure 116 shown in FIGS. 1A-1D.

In operation S40, the lower sacrificial layers and the upper sacrificial layers of each of the nanosheet stacks may be replaced by a lower gate structure and an upper gate structure, respectively, to form a plurality of 3DSFETs each including a lower field-effect transistor and an upper field-effect transistor on the substrate.

Thus, in each of the 3DSFETs, the contact isolation layer may be formed in the region between the lower gate structure and the substrate, and in the STI region.

In operation S50, the substrate may be replaced by a backside isolation structure which may represent the 3rd isolation structure 106 shown in FIGS. 1A-1D.

The backside isolation structure may be formed of a material the same as or similar to the material of the front isolation structure, for example, silicon oxide.

In operation S60, a contact hole may be formed in the backside isolation structure in a self-aligned form due to the contact isolation layer to expose the lower source/drain region of each of the 3DSFET. The contact hole may be extended to a region below the lower gate structure of each of the 3DSFETs and a region below the STI region to increase an alignment margin due to the contact isolation layer.

In operation S70, a backside contact plug may be formed in each of the contact holes to complete a semiconductor device including a plurality of 3DSFETs in which the self-aligned backside contact plugs are formed using the contact isolation layers.

FIG. 16 is a schematic block diagram illustrating an electronic device including the semiconductor device 10 or one of the 3DSFETs 10A and 10B included in the semiconductor device 10 as shown in FIGS. 1A-1D, according to an example embodiment.

Referring to FIG. 16, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 16, the electronic device 4000 may further include at least one sensor such as an image sensor.

At least one component in the electronic device 4000 may include the semiconductor device 10 or at least one of the 3DSFETs 10A and 10B included in the semiconductor device 10 shown in FIGS. 1A-1D.

In the above embodiments, each of the 3DSFETs 10A and 10B is implemented by a nanosheet transistor. However, the 3DSFETs 10A and 10B may each be implemented by a FinFET or any other type of transistor. Further, each of the lower field-effect transistor 100L and the upper field-effect transistor 100U forming each of the 3DSFETs 10A and 10B may be implemented by any type of transistor not being limited to a nanosheet transistor or a FinFET, according to embodiments. Moreover, the contact isolation layer 131 and the backside contact plug 107 formed in each of the 3DSFETs 10A and 10B may also be implemented in a single-stack transistor device, according to an embodiment.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor device comprising:

a $1^{st}$ transistor comprising $1^{st}$ source/drain regions, a $1^{st}$ gate structure, and a $1^{st}$ channel layer structure;

a contact isolation layer below the $1^{st}$ gate structure; and a backside contact plug connected to a first one of the $1^{st}$ source/drain regions, wherein the backside contact plug is below the first one of the $1^{st}$ source/drain regions and extends to a region below the $1^{st}$ gate structure, and isolated from the $1^{st}$ gate structure by the contact isolation layer, wherein the contact isolation layer extends below the $1^{st}$ channel layer structure, but does not extend below the first one of the $1^{st}$ source/drain regions, and wherein a first sidewall of the contact isolation layer has less curvature than a second sidewall of the contact isolation layer that is opposite the first sidewall.

2. The semiconductor device of claim 1, wherein the contact isolation layer comprises silicon nitride.

3. The semiconductor device of claim 1, wherein the backside contact plug is isolated from another circuit element by an isolation structure formed below the first one of the $1^{st}$ source/drain regions.

4. The semiconductor device of claim 3, wherein the contact isolation layer and the isolation structure comprise different materials.

5. The semiconductor device of claim 4, wherein the contact isolation layer comprises silicon nitride.

6. The semiconductor device of claim 1, further comprising:

a $2^{nd}$ transistor comprising $2^{nd}$ source/drain regions and a $2^{nd}$ gate structure; and a $1^{st}$ isolation structure isolating one of the $2^{nd}$ source/drain regions from one of the $1^{st}$ source/drain regions, wherein the $2^{nd}$ transistor is adjacent to the $1^{st}$ transistor in a $1^{st}$ horizontal direction, wherein a shallow trench isolation (STI) region is formed between the one of the $2^{nd}$ source/drain regions and the one of the $1^{st}$ source/drain regions and below the $1^{st}$ isolation structure, and wherein the contact isolation layer is formed in the STI region.

7. The semiconductor device of claim 6, wherein the contact isolation layer and the $1^{st}$ isolation structure comprise different materials.

8. The semiconductor device of claim 7, wherein the contact isolation layer comprises silicon nitride, and the $1^{st}$ isolation structure comprises silicon oxide.

9. The semiconductor device of claim 6, wherein the backside contact plug is formed in a $2^{nd}$ isolation structure below the first one of the $1^{st}$ source/drain regions, and wherein the backside contact plug is extended to a region below the STI region.

10. The semiconductor device of claim 1, further comprising a $2^{nd}$ transistor comprising $2^{nd}$ source/drain regions and a $2^{nd}$ gate structure, the $2^{nd}$ transistor stacked on the $1^{st}$ transistor, wherein one of the $2^{nd}$ source/drain regions is formed-above the first one of the $1^{st}$ source/drain regions and isolated from the first one of the $1^{st}$ source/drain regions through an isolation structure that comprises a material different from a material included in the contact isolation layer.

11. The semiconductor device of claim 1, wherein the first sidewall of the contact isolation layer is linear, and the second sidewall of the contact isolation layer that is opposite the first sidewall has a curved shape.

12. The semiconductor device of claim 1, wherein the second sidewall has a curved shape that extends into the backside contact plug.

13. The semiconductor device of claim 1, wherein the contact isolation layer has a first width that is same as a second width of the $1^{st}$ channel layer structure.

14. A semiconductor device comprising:

a $1^{st}$ transistor comprising $1^{st}$ source/drain regions, a $1^{st}$ gate structure, and a $1^{st}$ channel layer structure;

a contact isolation layer below a first one of the $1^{st}$ source/drain regions;

a backside contact plug connected to the first one of the $1^{st}$ source/drain regions; and a shallow trench isolation (STI) region at a side of the first one of the $1^{st}$ source/drain regions, wherein the STI region comprises the contact isolation layer, wherein the backside contact plug is extended to a region below the STI region, wherein the contact isolation layer extends below the $1^{st}$ channel layer structure, but does not extend below the first one of the $1^{st}$ source/drain regions, and wherein a first sidewall of the contact isolation layer has less curvature than a second sidewall of the contact isolation layer that is opposite the first sidewall.

15. The semiconductor device of claim 14, further comprising an isolation structure below the first one of the $1^{st}$ source/drain regions and at a side of the backside contact plug, wherein the contact isolation layer is extended to a region below the $1^{st}$ gate structure.

16. The semiconductor device of claim 15, wherein a bottom surface of the STI region is below a level of a bottom surface of the contact isolation layer below the $1^{st}$ gate structure and a level of a bottom surface of the first one of the $1^{st}$ source/drain regions.

17. The semiconductor device of claim 16, wherein the contact isolation layer has an etch selectivity against the isolation structure, or the contact isolation layer has an etch rate different from that of the isolation structure.

18. The semiconductor device of claim 15, wherein the contact isolation layer and the isolation structure comprise different materials.

19. The semiconductor device of claim 14, wherein a portion of the backside contact plug contacting the STI region has a different shape as an opposite portion of the backside contact plug.

20. The semiconductor device of claim 14, further comprising:

a $2^{nd}$ transistor comprising $2^{nd}$ source/drain regions and a $2^{nd}$ gate structure; and an isolation structure isolating one of the $2^{nd}$ source/drain regions from the first one of the $1^{st}$ source/drain regions, wherein the $2^{nd}$ transistor is adjacent to the $1^{st}$ transistor in a horizontal direction, and wherein the contact isolation layer and the isolation structure comprise different materials.

* * * * *